US007895406B2

(12) United States Patent
Nagao

(10) Patent No.: US 7,895,406 B2
(45) Date of Patent: Feb. 22, 2011

(54) MEMORY DEVICE AND PASSWORD STORING METHOD THEREOF

(75) Inventor: Mitsuhiro Nagao, Gifu-Prefecture (JP)

(73) Assignee: Spansion LLC, Sunnyvale, CA (US)

( * ) Notice: Subject to any disclaimer, the term of this patent is extended or adjusted under 35 U.S.C. 154(b) by 586 days.

(21) Appl. No.: 11/986,332

(22) Filed: Nov. 20, 2007

(65) Prior Publication Data

US 2008/0147967 A1 Jun. 19, 2008

Related U.S. Application Data

(63) Continuation-in-part of application No. PCT/JP2006/340143, filed on Dec. 18, 2006.

(30) Foreign Application Priority Data

Dec. 18, 2006 (JP) ............................. 2006-340143

(51) Int. Cl.
*G06F 12/00* (2006.01)
(52) U.S. Cl. ..................................................... 711/164
(58) Field of Classification Search ........................ None
See application file for complete search history.

(56) References Cited

U.S. PATENT DOCUMENTS 6,229,731 B1 5/2001 Kasai et al. ............ 365/185.04

7,502,936 B2 * 3/2009 Weatherford et al. ....... 713/184
2005/0008151 A1 1/2005 Liang
2007/0250914 A1 * 10/2007 Fazal et al. ..................... 726/5
2008/0083016 A1 * 4/2008 Itoh ............................. 726/2
2008/0285754 A1 * 11/2008 Kezmann ..................... 380/259
2009/0328162 A1 * 12/2009 Kokumai et al. ............... 726/5

FOREIGN PATENT DOCUMENTS

| JP | 02-267657 | 11/1990 |
| JP | 11-085620 | 3/1999 |
| JP | 2000-215108 | 4/2000 |
| JP | 2000-222288 | 8/2000 |
| JP | 2002-7349 | 1/2002 |
| JP | 2002-229855 | 8/2002 |
| JP | 2004 046640 A | 2/2004 |
| WO | 01-61692 A | 8/2001 |

* cited by examiner

*Primary Examiner*—Hiep T Nguyen

(57) ABSTRACT

To provide a memory device and a password storing method thereof, according to which an improved security function is realized by resourcefully designing the storage position and/or storing order of password data stored in the memory device to prevent unauthorized password acquisition. The memory device makes a determination of whether or not rewriting and/or reading of data is permitted by verification of a password, the memory device comprising a plurality of partial memory areas which store a plurality of partial bit strings that comprise a bit string of the password, and wherein the plurality of partial memory areas are located apart from each other in a memory cell array.

20 Claims, 14 Drawing Sheets

FIG. 4

| \multicolumn{6}{c|}{EXTERNAL ADDRESSES} | \multicolumn{6}{c|}{INTERNAL ADDRESSES} | |

| A5 | A4 | A3 | A2 | A1 | A0 | WA5 | WA4 | WA3 | WA2 | WA1 | WA0 | YDx |
|----|----|----|----|----|----|-----|-----|-----|-----|-----|-----|-----|
| 0 | 0 | 0 | 0 | 0 | 0 | 0 | 0 | 0 | 0 | 0 | 0 | YD0 |
| 0 | 0 | 0 | 0 | 0 | 1 | 0 | 0 | 0 | 0 | 0 | 1 | YD1 |
| 0 | 0 | 0 | 0 | 1 | 0 | 0 | 0 | 0 | 0 | 1 | 0 | YD2 |
| 0 | 0 | 0 | 0 | 1 | 1 | 0 | 0 | 0 | 0 | 1 | 1 | YD3 |
| ⋮ | ⋮ | ⋮ | ⋮ | ⋮ | ⋮ | ⋮ | ⋮ | ⋮ | ⋮ | ⋮ | ⋮ | ⋮ |
| 1 | 1 | 1 | 1 | 1 | 1 | 1 | 1 | 1 | 1 | 1 | 1 | YD63 |

FIG. 5

| A5 | A4 | A3 | A2 | A1 | A0 | WA5 | WA4 | WA3 | WA2 | WA1 | WA0 | YDx |
|----|----|----|----|----|----|-----|-----|-----|-----|-----|-----|-----|
| X | X | X | X | 0 | 0 | 0 | 0 | 0 | 0 | 0 | 0 | YD0 |
| X | X | X | X | 0 | 1 | 0 | 1 | 0 | 0 | 0 | 0 | YD16 |
| X | X | X | X | 1 | 0 | 1 | 0 | 0 | 0 | 0 | 0 | YD32 |
| X | X | X | X | 1 | 1 | 1 | 1 | 0 | 0 | 0 | 0 | YD48 |

FIG. 7

| EXTERNAL ADDRESSES | | | | | | INTERNAL ADDRESSES | | | | | | |
|---|---|---|---|---|---|---|---|---|---|---|---|---|
| A5 | A4 | A3 | A2 | A1 | A0 | WA5 | WA4 | WA3 | WA2 | WA1 | WA0 | YSEL |
| X | X | X | X | 0 | 0 | 0 | 0 | 0 | 0 | 0 | 0 | YD0 |
| X | X | X | X | 0 | 1 | 1 | 0 | 0 | 0 | 0 | 0 | YD32 |
| X | X | X | X | 1 | 0 | 0 | 1 | 0 | 0 | 0 | 0 | YD16 |
| X | X | X | X | 1 | 1 | 1 | 1 | 0 | 0 | 0 | 0 | YD48 |

FIG. 9

| EXTERNAL ADDRESSES | | | | | | INTERNAL ADDRESSES | | | | | | |
|---|---|---|---|---|---|---|---|---|---|---|---|---|
| A5 | A4 | A3 | A2 | A1 | A0 | WA5 | WA4 | WA3 | WA2 | WA1 | WA0 | YSEL |
| X | X | X | X | 0 | 0 | 1 | 1 | 0 | 0 | 0 | 0 | YD48 |
| X | X | X | X | 0 | 1 | 1 | 0 | 0 | 0 | 0 | 0 | YD32 |
| X | X | X | X | 1 | 0 | 0 | 1 | 0 | 0 | 0 | 0 | YD16 |
| X | X | X | X | 1 | 1 | 0 | 0 | 0 | 0 | 0 | 0 | YD0 |

MEMORY DEVICE AND PASSWORD STORING METHOD THEREOF

CLAIM OF PRIORITY

This is a continuation-in-part of International Application No. JP 2006/340143, filed Dec. 18, 2006 which was not published in English under PCT Article 21(2).

FIELD OF THE INVENTION

The present invention relates to a memory device having a security function. More particularly, the present invention relates to a memory device and a password storing method thereof, according to which password verification is required to access data stored in the memory device.

BACKGROUND ART

Recently, nonvolatile memory devices have been used for the electronic storage of data. Flash memory is a common example of nonvolatile memory. Since the data contained in the memory device can be of a sensitive or confidential nature, providing security from tampering with or accessing of the data is desired. The semiconductor integrated circuit with a packaged nonvolatile memory chip and logic IC chip disclosed in Japanese Unexamined Patent Publication No. 2000-215108 includes a comparator means for making a comparison between reference data pre-stored in the nonvolatile memory chip and collation data input from outside; and a means for allowing or refusing readout of data stored in the nonvolatile memory chip in accordance with the result of the comparison made by the comparator means. This enables a security function in which data output is allowed when access is attempted by authorized users and refused when access is attempted by unauthorized users.

Another related art is disclosed in Japanese Unexamined Patent Publication No. 211 (1999)-85620.

The above prior art techniques are associated with a security function according to which a password, which is reference data, is pre-stored in the nonvolatile memory chip and compared with collation data input from outside, thereby identifying an authorized user access.

However, the prior art techniques do not teach how the storage reference data (hereinafter referred to as "a password") in the nonvolatile memory chip can be accomplished. Furthermore, they do not suggest a means of inhibiting fraudulent password acquisition, so that a password can be effectively protected from a risk of acquisition by unauthorized users.

Generally, a password is a string of bit data that is usually stored in a continuous manner in a desired memory cell area of a memory cell array. Therefore, if the address of the memory cell area or the address of a particular memory cell in the memory cell area is fraudulently obtained, the password can easily be discerned from the bit data stored in the area having the address or the area anterior or posterior to the address.

As such, there exists a need for a device and a means of securing a password pre-stored in a nonvolatile memory chip from fraudulent discovery and use.

SUMMARY OF THE INVENTION

The present invention has been made to overcome the above drawbacks of the prior art and provide a memory device and a password storing method thereof, according to which an improved security function is realized by resourcefully designing the storage position and/or storing order of password data stored in the memory device to prevent unauthorized password acquisition.

According to an aspect of the invention, there is provided a memory device which makes a determination of whether or not rewriting and/or reading of data is permitted by verification of a password, the memory device comprising: a plurality of partial memory areas, each of which stores each of a plurality of partial bit strings that comprise a bit string of the password, and wherein the plurality of partial memory areas are located apart from each other in a memory cell array.

According to an embodiment of the memory device of the invention, when storing in the memory device, a password used for determining whether data rewriting and/or data reading is permitted, a plurality of partial bit strings, which constitute the bit string of the password, are stored in a plurality of partial memory areas spaced apart from one another in a memory cell array.

According to another embodiment of the present invention, there is further provided a password storing method of a memory device which makes a determination of whether or not rewriting and/or reading of data is permitted by verification of a password, the method comprising: storing each of a plurality of partial bit strings that comprise a bit string of the password to be located apart from each other.

According to an embodiment of the password storing method of a memory device of the invention, when storing, in the memory device, a password used for judging whether data rewriting and/or data reading is permitted, a plurality of partial bit strings, which constitute the bit string of the password, are stored so as to be spaced apart from one another in a memory cell array.

With the above arrangement, when storing a password in a memory cell array, the password is divided into a plurality of partial bit strings and these partial bit strings are discretely stored. Therefore, all the bit strings that constitute the password are not stored in a continuous manner in a particular memory area. Even if someone fraudulently obtains, in some way, the address of one partial memory area or a particular memory cell of a partial memory area where a partial bit string is stored, the other partial memory areas where other partial bit strings are stored would still be unknown. As such, it would be difficult to fraudulently obtain all the bit strings that constitute the password, so that a highly reliable security function can be ensured.

BRIEF DESCRIPTION OF THE DRAWINGS

FIG. 4 shows an address decode in a normal access state in accordance with an embodiment of the invention;

FIG. 5 shows an address decode in a password program state according to the first embodiment;

FIG. 7 shows an address decode in a password program state according to the second embodiment;

FIG. 9 shows an address decode in a password program state according to the third embodiment;

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention to these embodiments. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Referring now to FIGS. 1 to 11 of the accompanying drawings, the memory device and password storing device thereof of the invention is now described in detail according to preferred embodiments.

Figure 1:
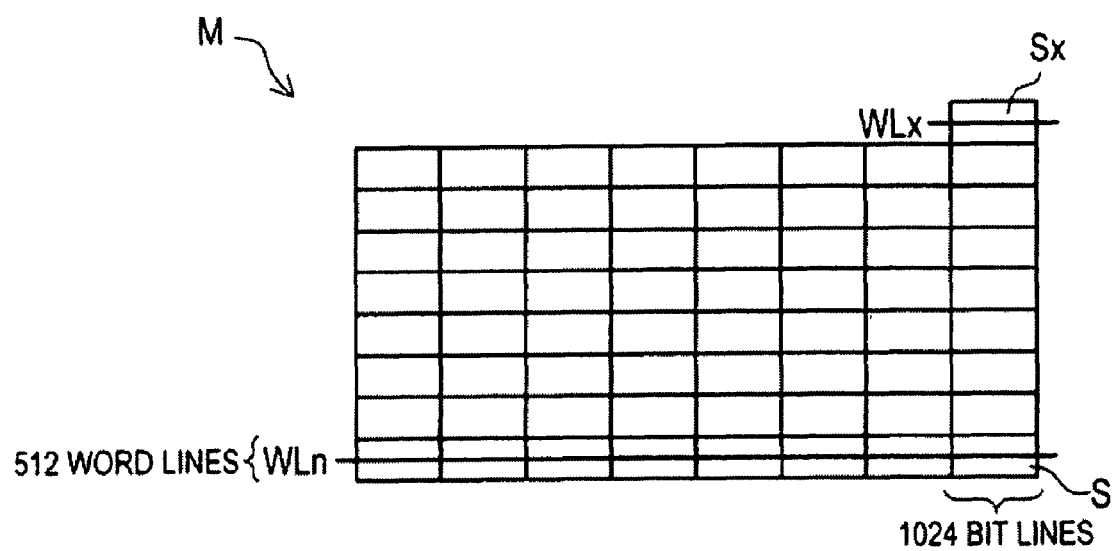
FIG. 1 is a pattern diagram of a memory cell array in accordance with an embodiment of the invention.

FIG. 1 diagrammatically shows a memory cell array M. The memory cell array M in the form of a matrix has a sector S for every memory cell area coupled to 512 word lines WLn and 1024 bit lines. The sector S stated herein is one unit on which a predetermined access operation is performed. In a flash memory for instance, the sector S serves as one unit for data erase operation.

The memory cell array M has an auxiliary memory block (hereinafter referred to as "an auxiliary sector Sx"). Unlike the data memory area open to the user, the auxiliary sector Sx stores various kinds of control information such as write protection data, redundancy data, adjustment data (e.g., bias voltage) and various kinds of administrative information such as serial numbers. A CAM (contents addressable memory) area serves as one example of the auxiliary section Sx. Password data used in the security function is also stored in the auxiliary section Sx. In the following description, a case where a nonvolatile memory cell such as a flash memory is placed as the memory cell array M will be explained as one example.

The security function may be implemented—by setting a password for example—by locking the write protect status of each sector S by use of a password. In a locked condition, commands for releasing the protect status or setting the protect status are ignored. The security function can be ensured by forbidding a change in the protect status of the sectors S. In order to release the locked condition, a code input from outside needs to match the password programmed in the auxiliary sector Sx beforehand. In cases where the releasing operation is performed by inputting a command, an input code is input from outside upon receipt of a lock release command. Subsequently, a password programmed in the auxiliary sector Sx is read out. The input code is compared with the password and if they correspond with each other, rewriting of the protect information becomes possible.

For the password matching comparison, a password needs to be programmed in the auxiliary sector Sx beforehand. In one embodiment this program operation is performed by inputting a command, the memory area of the auxiliary sector Sx in which a password is to be programmed becomes accessible upon receipt of a password program command and programming of the password is then carried out by a normal program operation. After completion of the programming, reading of the programmed password to outside is inhibited. In one embodiment this is implemented by a technique in which a flag or the like indicating that a password has been set in a CAM area is programmed and readout of the password is inhibited using this flag.

Thereby, the password is not read to outside in a normal situation. Even if unauthorized reading is done by an unauthorized person seeking access to the data, it is difficult to find out the password from the bit data string which has been read. This technique substantially protects the password from unauthorized reading.

Figure 2:
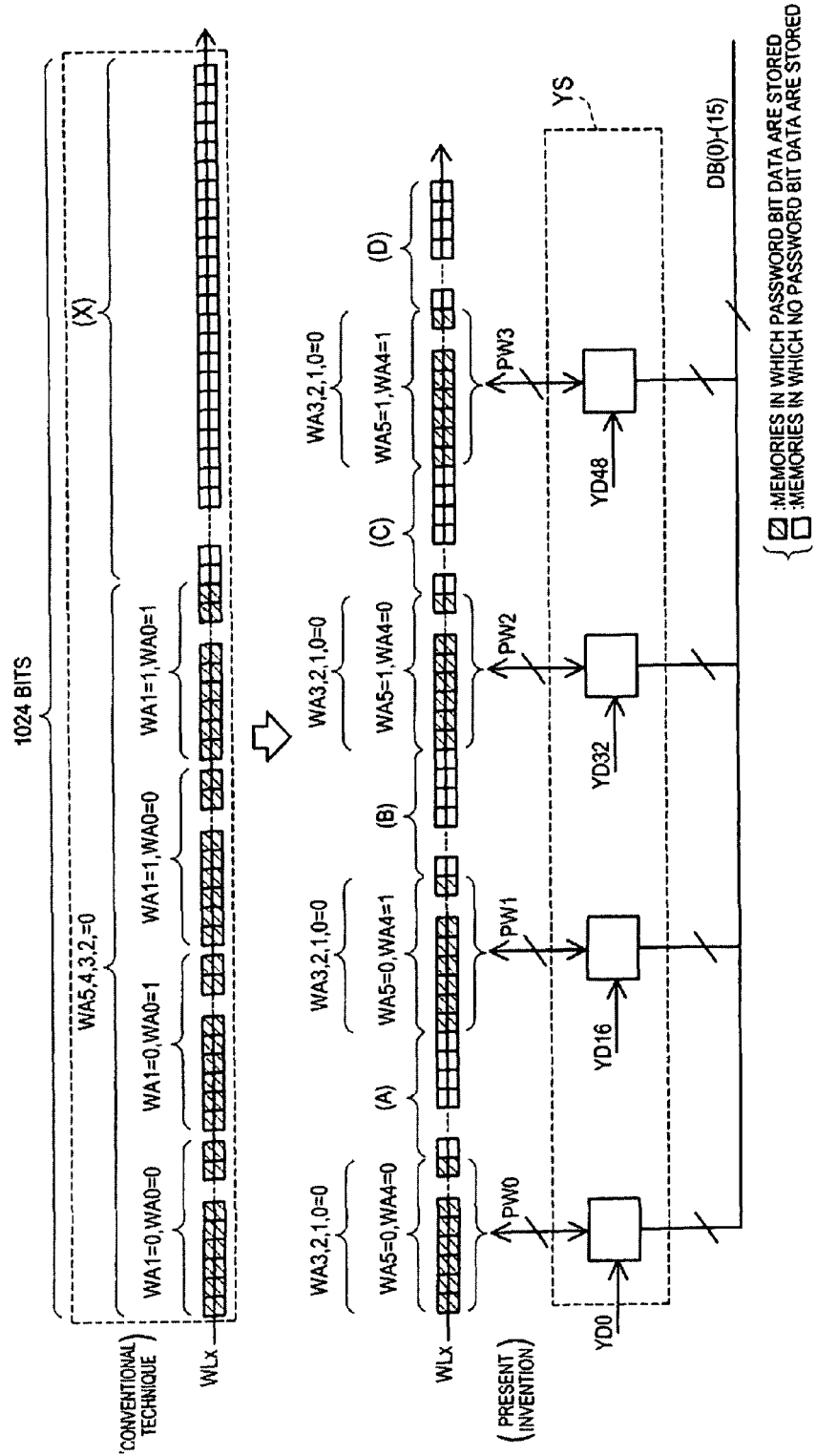
FIG. 2 shows the positions of partial memory areas in which the partial bit strings of a password are stored according to a first embodiment.

FIGS. 2 to 6 are associated with a first embodiment. FIG. 2 shows the position of partial memory areas within the auxiliary sector Sx, in which a password is programmed. For purposes of comparison, the position corresponding to the prior art is shown.

When programming a password, either the row address or the column address is sequentially changed with the other being fixed. This technique simplifies the circuit operation including decoding time, etc. and is therefore convenient in view of access time and current consumption. According to an embodiment of the present invention, it is theoretically more desirable to change the column address while fixing the row address, for the reason that a high-speed access to a desired memory cell is enabled by changing a column selector switch according to the column address.

FIG. 2 depicts an embodiment of the invention where a password comprised of a string of 64 bits is divided into partial bit strings PW0 to PW3, each partial bit string having 16 bits, and is programmed in a memory cell group selected by one word line WLx. The bit string of the password is divided into the partial bit strings PW0 to PW3 each comprised of 16 bits. The data lines DB(0) to DB(15) are 16 bits wide. By a column selector switch YS turned ON/OFF by column selection signals YD0, YD16, YD32, YD48 among column selection signals YDx, the data lines DB(0) to DB(15) are selectively coupled to or uncoupled from bit lines (not shown). Programming and reading are performed on the partial bit strings PW0 to PW3 (each comprised of 16 bits).

Figure 3:
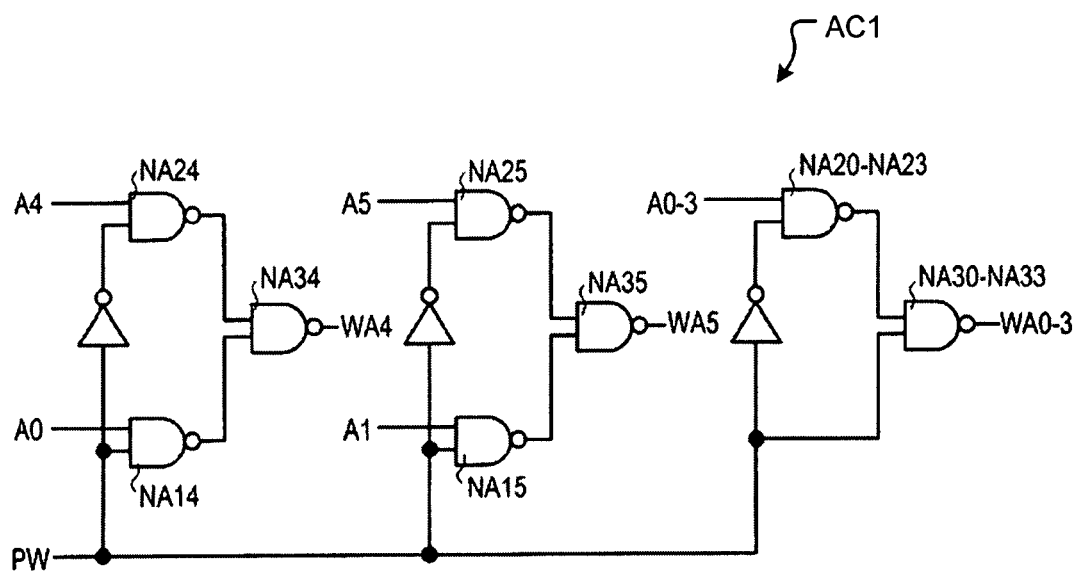
FIG. 3 shows one example of the first address converter circuit according to the first embodiment.

Bit allocation on the common word line WLx for programming the bit string of the password is determined by an address decoder AC1 shown in FIG. 3. The address decoder AC1 shown in FIG. 3 is a circuit for converting external addresses A0 to A5 into internal addresses WA0 to WA5. The address decoder AC1 serves as one example of the first address converter circuit. The internal addresses WA0 to WA5 stated herein are column addresses. According to the internal addresses WA0 to WA5, the column selection signals YDx are selected.

A password mode signal PW indicates a state in which a password program command or password collation command has been input so that the password data is now being accessed. The password mode signal PW is input to NAND gates NA14, NA15 together with the external addresses A0, A1, respectively. Also, the password mode signal PW is inverted by an inverter gate and input to NAND gates NA20 to NA25 together with the external addresses A0 to A5, respectively. Output signals from the NAND gates NA14, NA15 and the NAND gates NA24, NA25 are input to NAND gates NA34, NA35, respectively. Output signals from the NAND gates NA20 to NA23 are input to NAND gates NA30 to NA33, respectively, together with the password mode signal PW. The NAND gates NA30 to NA35 output the internal addresses WA0 to WA5.

FIG. 5 shows how the bit allocation of the internal addresses WA0 to WA5 is converted relative to the external addresses A0 to A5 by the address decoder AC1 shown in FIG. 3, in a password program state with a password program command being input. FIG. 4 shows a normal decoded state with no password program command being input.

In the normal decoded state (FIG. 4), the password mode signal PW is at a low level and in an inactive state. In FIG. 3, the output signals of the NAND gates NA14, NA15 are fixed to a high level in an inactive state. The external addresses A0 to A5 are output through the NAND gates NA20 to NA25 and the NAND gates NA30 to NA35, as the internal addresses WA0 to WA5. According to the logical combination of the internal addresses WA0 to WA5, the column selection signals YIJx are activated. FIG. 4 shows the allocation of the column selection signals YDx in the ascending order of powers in correspondence with the bit order of the internal addresses WA0 to WA5 arranged in the ascending order of powers. This enables selection of memory cells with the same bit allocation as the external addresses A0 to A5.

In the password programmed state (FIG. 5), the password mode signal PW is at a high level. In FIG. 3, the output signals of the NAND gates NA20 to NA25 are fixed to a high level and in an inactive state. The external addresses A0, A1 are output through the NAND gates NA14, NA15 and the NAND gates NA34, NA35, as the internal addresses WA4, WA5. The bit allocation of the external addresses A0, A1 is converted into the internal addresses WA4, WA5. Further, the output signals of the NAND gates NA30 to NA33 are fixed to a low level. The reason for this is that the input signals are all fixed to a high level.

With the above arrangement, while the logical levels of the internal addresses WA0 to WA3 are fixed to a low level, the bit allocation of the external addresses A0, A1 which are the lowest two bits is converted into the bit allocation of the internal addresses WA4, WA5 which are the highest two of the internal addresses WA0 to WA5 indicative of column addresses. The password, which has been input by changing the external addresses A0, A1 for each of the partial 16-bit strings PW0 to PW3, is programmed in memory cell positions evenly and discretely arranged per 16 bits on the common word line WLx.

This condition is shown in FIG. 2. In the prior art technique, the high order internal addresses WA2 to WA5 are fixed to a low level and the password is collectively programmed in the memory area which extends from the lowest bit position over 64 bits identified by the internal addresses WA0, WA1. That is, the wide memory area (X) of high order 960 bits is not defined as the password memory area.

In contrast with the above technique, the first embodiment is designed such that since the partial memory areas are discretely arranged on a 16 bit basis, memory areas, which are not defined as the password memory area and sandwiched between the partial memory areas, are discretely positioned on a 240 bit basis (see the memory areas (A) to (D)).

Thereby, the bit allocation of the external addresses A0, A1 is converted into high order bit positions as the bit allocation of the internal addresses WA4, WA5, so that the partial bit strings PW0 to PW3 constituting the password are discretely distributed and programmed on a partial 16-bit string basis in the group of memory cells coupled to the common word line WLx within the auxiliary sector Sx. That is, the partial memory areas in which the partial bit strings PW0 to PW3 are programmed are discretely positioned. Therefore, even if an internal address indicative of any one of the partial bit strings or an internal address indicative of a particular memory cell within a partial bit string is obtained by fraudulent means, the bit data programmed in the memory cells adjacent to the partial memory area or memory cell of the internal address that has been fraudulently obtained is not the bit data of the bit strings of the password. This makes it difficult to obtain the password by fraudulent means such as hacking so that an improved security function can be ensured.

The bit data stored in the partial memory areas for storing the password and the bit data stored in the memory areas (A) to (D) each sandwiched between the partial memory areas sometimes have a special bit pattern. For instance, if the memory areas (A) to (D) are in a data erased state and therefore no valid data is stored therein, the bit strings of the password would be located between the bit values indicating the erased state. It is therefore conceivable that the password may be easily obtained from the particular pattern of the bit strings.

To solve this problem, the control information and administration information programmed in the auxiliary sector Sx are programmed in the memory areas (A) to (D). This allows programming of bit strings including high level and low level bit strings in a mixed fashion in the memory areas sandwiched between the partial memory areas, so that it becomes even more difficult to distinguish the partial bit strings of the password programmed in the partial memory areas from others. As a result, this makes it difficult to identify the bit strings of the password by unauthorized reading so that an improved security function can be ensured.

It is apparent that the same effect of the above can be obtained by programming dummy data in place of or together with control information and administration information.

Figure 6:
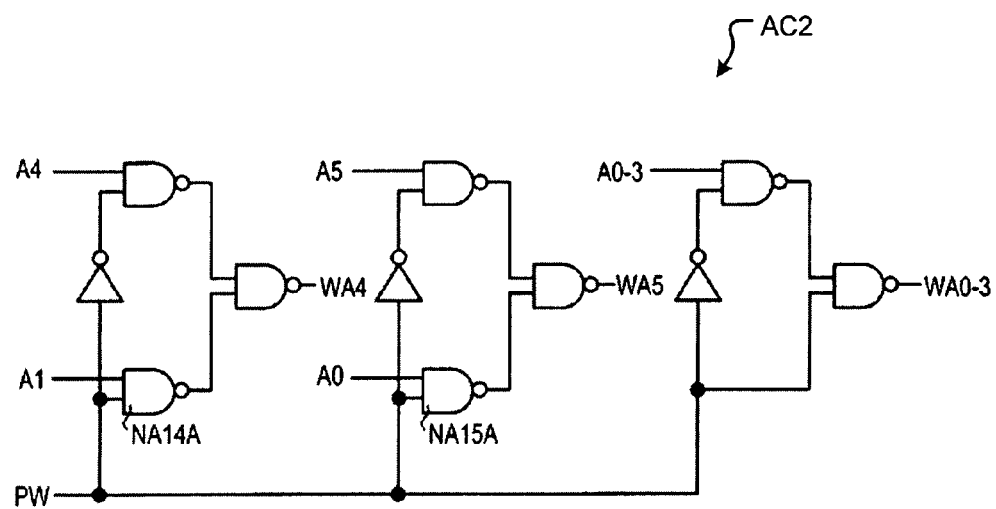
FIG. 6 shows one example of the first address converter circuit according to a second embodiment.

FIGS. 6, 7 are associated with a second embodiment. FIG. 6 shows an address decoder AC2 according to the second embodiment wherein the decoder is a circuit for converting the external addresses A0 to A5 into the internal addresses WA0 to WA5. This address decoder AC2 includes NAND gates NA14A, NA15A in place of the NAND gates NA14, NA15 provided in the address decoder AC1 of the first embodiment (FIG. 3). To the NAND gate NA14A, an external address A1 is input instead of the external address A0 input to the NAND gate NA14. To the NAND gate NA15A, an external address A0 is input instead of the external address A1 input to the NAND gate NA15.

FIG. 7 shows how the bit allocation of the internal addresses WA0 to WA5 is converted relative to the external addresses A0 to A5 by the address decoder AC2 shown in FIG. 6, in a password program state with a password program command being input.

The normal decoded state in this embodiment does not differ from that of the address decoder of the first embodiment (FIG. 3).

In the password program state, the internal addresses WA0 to WA3 are fixed to a low level, similarly to the address decoder shown in FIG. 3. The address decoder AC2 of FIG. 6 outputs the external addresses A0, A1 as the internal addresses WA5, WA4. The bit allocation of the external addresses A0, A1 is converted into the internal addresses WA5, WA4 so that the bit allocation of this embodiment is opposite to that of the first embodiment.

Thereby, while the logical levels of the internal addresses WA0 to WA3 being fixed to a low level, the bit allocation of the external addresses A0, A1 which are the lowest two bits is converted into the bit allocation of the internal addresses WA5, WA4 which are the highest two of the internal addresses WA0 to WA5 indicative of column addresses, by interchanging the bit positions. The password, which has been input by changing the external addresses A0, A1 for each of the partial 16-bit strings PW0 to PW3, is evenly distributed on a 16 bit basis on the common word line WLx and programmed in memory cell positions of which selection sequence has been changed.

The external addresses (A0, A1) are (0, 1), (1, 0) and, with these addresses, column selection signals YD32, YD16 are selected. This bit allocation is reverse to the program positions of the partial bit strings PW1, PW2 shown in FIG. 2.

With the above arrangement, the bit allocation of the external addresses A0, A1 is converted into high order bit positions as the bit allocation of the internal addresses WA5, WA4, and the selection sequence can be changed. The partial bit strings PW0 to PW3 of the password are discretely distributed and programmed on a partial 16-bit string basis in the group of memory cells coupled to the common word line WLx within the auxiliary sector Sx, after the selection sequence has been changed. Therefore, even if an internal address indicative of any one of the partial bit strings or an internal address indicative of a particular memory cell within a partial bit string is obtained by fraudulent means, the bit data programmed in the memory cells adjacent to the partial memory area or memory cell of the internal address that has been fraudulently obtained is not necessarily the bit data of the bit strings of the password. This makes it difficult to obtain the password by fraudulent means such as hacking so that an improved security function can be ensured.

Figure 8:
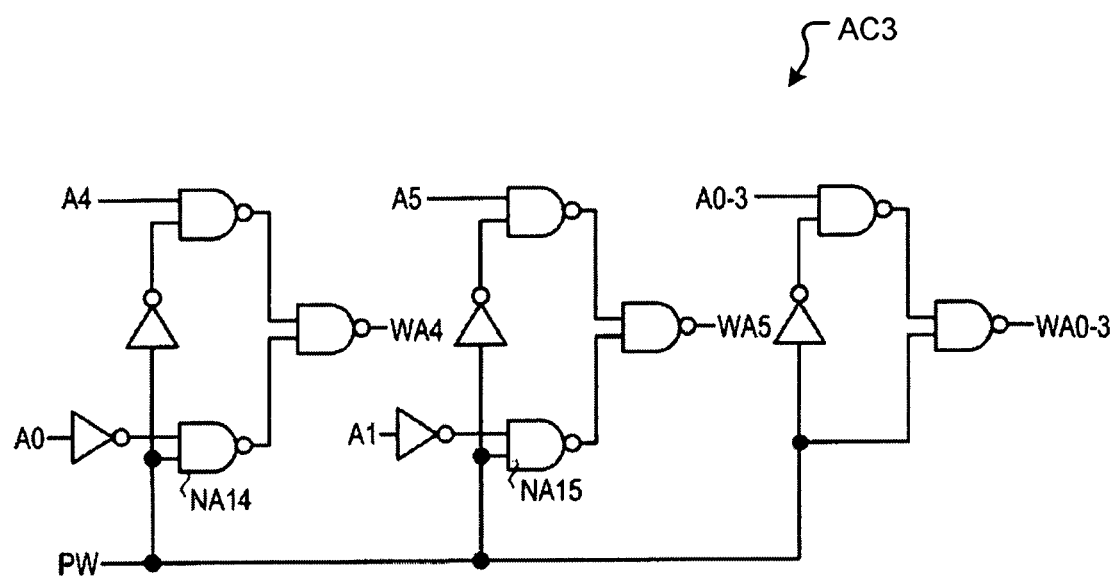
FIG. 8 shows one example of the first address converter circuit according to a third embodiment.

FIGS. 8, 9 are associated with a third embodiment. FIG. 8 shows an address decoder AC3 according to the third embodiment wherein the decoder is a circuit for converting the external addresses A0 to A5 into the internal addresses WA0 to WA5. This address decoder inverts the external addresses A0, A1 with the inverter gate, instead of the external addresses A0, A1 which are input to the NAND gates NA4, NA15 of the address decoder AC1 of the first embodiment (FIG. 3).

FIG. 9 shows how the bit allocation of the internal addresses WA0 to WA5 is converted relative to the external addresses A0 to A5 by the address decoder AC3 shown in FIG. 8, in a password program state with a password program command being input. The normal decoded state of the address decoder of the third embodiment is the same as of the address decoders AC1 and AC2 of the first and second embodiments (FIGS. 3, 6) and therefore, an explanation thereof is skipped herein.

In the password program state, the internal addresses WA0 to WA3 are fixed to a low level, similarly to the address decoders shown in FIGS. 3, 6. The address decoder AC3 shown in FIG. 8 inverts the external addresses A0, A1 and outputs them as the internal addresses WA4, WA5. The external addresses A0, A1 are logically inverted and converted into the bit allocation of the internal addresses WA4, WA5. Thereby, while the logical levels of the internal addresses WA0 to WA3 being fixed to a low level, the logical levels of the external addresses A0, A1 (the lowest two bits) are inverted and their bit allocation is converted into the bit allocation of the internal addresses WA4 and WA5 which are the highest of the internal addresses WA0 to WA5 that are indicative of the column addresses. The password, which has been input by changing the external addresses A0, A1 for each of the partial 16-bit strings PW0 to PW3, is programmed in memory cell positions which are evenly and discretely distributed on a 16 bit basis on the common word line WLx and whose selection sequence is inverted. This bit allocation is inverse to the program positions of the partial bit strings PW0 to PW3 shown in FIG. 2.

With the above arrangement, the bit allocation of the external addresses A0, A1 can be converted into high bit positions as the bit allocation of the internal addresses WA4, WA5, and the selection sequence can be inverted. The partial bit strings PW0 to PW3 of the password are inverted in their selection sequence and discretely distributed on a partial 16-bit string basis in the group of memory cells coupled to the common word line WLx within the auxiliary sector Sx. Therefore, even if an internal address indicative of any one of the partial bit strings or an internal address indicative of a particular memory cell within a partial bit string is obtained by fraudulent means, the bit data programmed in the memory cells adjacent to the partial memory area or memory cell of the internal address that has been fraudulently obtained is not necessarily the bit data of the bit strings of the password. This makes it difficult to obtain the password by fraudulent means such as hacking so that a further improved security function can be achieved.

Figure 10:
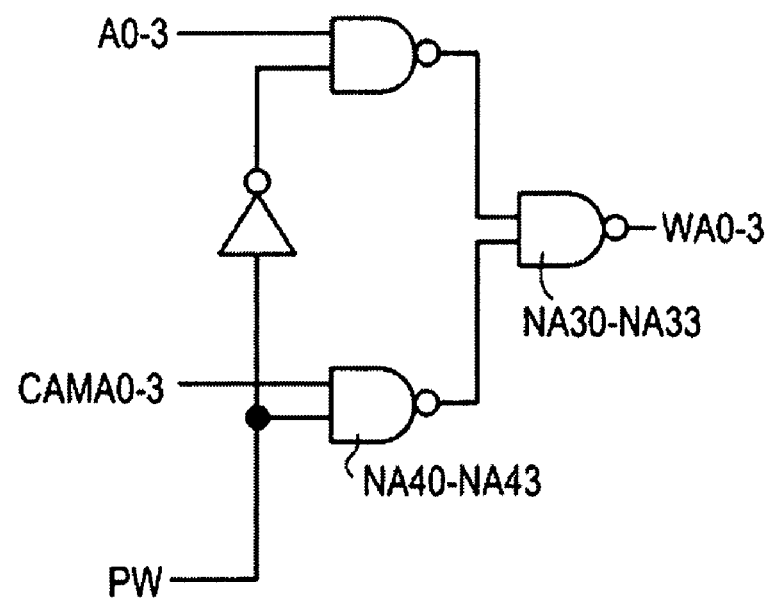
FIG. 10 shows one example of the second address converter circuit according to a fourth embodiment.
Figure 11:
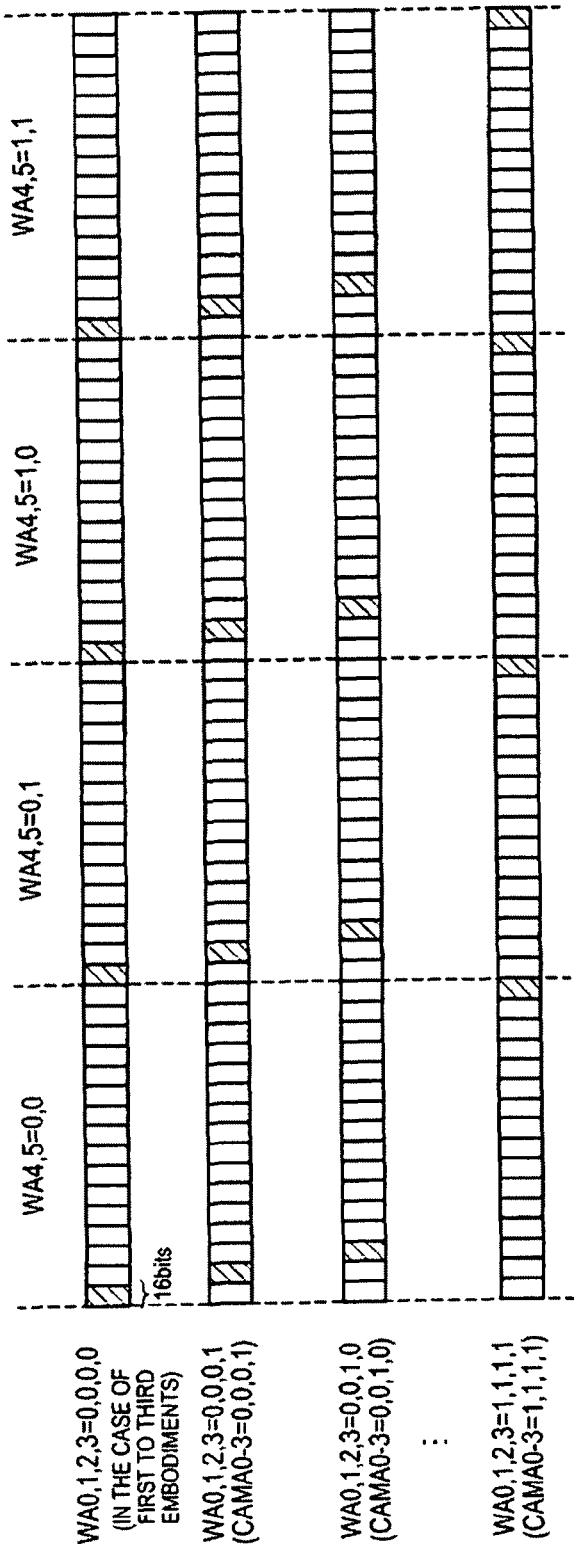
FIG. 11 shows the positions of partial memory areas in which the partial bit strings of a password are stored according to the fourth embodiment.

FIGS. 10, 11 are associated with a fourth embodiment. Although the internal addresses WA0 to WA3 are fixed to a low level in the password program state in the first to third embodiments, the 4-bit data of these addresses may be set to a desired value in the fourth embodiment. The bit strings to be set in the internal addresses WA0 to WA3 are programmed in the CAM area beforehand in the program state and output as the internal addresses WA0 to WA3 in response to the password mode signal of a high level. The CAM area stated herein serves as one example of the information storage section.

The setting of the internal addresses WA0 to WA3 in the password program state is carried out by the address decoder shown in FIG. 10. FIG. 10 shows an address decoder that is a circuit for allocating CAM addresses CAMA0 to CAMA3 programmed in the CAM area to the internal addresses WA0 to WA3. This address decoder serves as one example of the second address converter circuit.

The address decoder of the fourth embodiment is provided with NAND gates NA40 to NA43 in addition to the address decoder for outputting the internal addresses WA0 to WA3 in the address decoders of the first to third embodiments (FIGS. 3, 6, 8). The CAM addresses CAM0 to CAM3 are input to the NAND gates NA40 to NA43, respectively, together with a password mode signal PW. The output signals of the NAND gates NA40 to NA43 are input to the NAND gates NA30 to NA33, respectively.

The normal decoded state of the fourth embodiment does not differ from those of the address decoders of the first to third embodiments (FIGS. 3, 6, 8).

In the password program state, the CAM addresses CAMA0 to CAMA3 are output as the internal addresses WA0 to WA3. The CAM addresses CAMA0 to CAMA3 are bit strings programmed in the CAM area beforehand. According to the bit strings of the CAM addresses CAMA0 to CAMA3, the position of a partial memory area on the common word line WLx can be designated.

This condition is shown in FIG. 11. The internal addresses WA0 to WA3 are all at a low level in the first to third embodiments. The lowest bit position in the memory areas defined by the high order internal addresses WA4, WA5 is a partial memory area.

By setting the internal addresses WA0 to WA3 in accordance with the CAM addresses CAMA0 to CAMA3 programmed in the CAM area beforehand, the partial memory areas can be shifted according to the bit data of the CAM addresses CAMA0 to CAMA3.

Thereby, the partial memory areas in which the password is to be programmed can be changed even in the same device by changing the bit strings to be programmed in the CAM area, which makes fraudulent acquisition of the password more difficult. Consequently, a further improved security function can be achieved.

As understood from the above description, it is conceivable in these embodiments that the password is programmed and treated independently from normal data and the memory cell area in which the password is programmed is provided in a particular area within the memory cell array. In this case, when programming the password in the memory cell array, the program is divided into a plurality of partial bit strings PW0 to PW3 and these partial bit strings are discretely programmed, whereby all the bit strings that constitute the password are not continuously programmed in a particular memory area. With this arrangement, even if the address of one partial memory area or a particular memory cell of a partial memory area where one of the partial bit strings PW0 to PW3 is stored is fraudulently obtained, the other partial memory areas where other partial bit strings are stored cannot be simultaneously or proximately ascertained. Accordingly, it is difficult to fraudulently obtain all the bit strings that constitute the password, so that a highly reliable security function can be ensured.

Although the foregoing embodiments have been described in the context of the auxiliary sector Sx which is separately provided from the group of normal sectors S, the invention is not necessarily limited to this. The invention is equally applicable to cases where one of the sectors S is used as a memory area in which control information or administration information is programmed and a part of this sector S is used as a password programming area. In this modification, the common word line WLx is also used as the word line of the memory area used by the user. If a bit string of the password is fraudulently read out, the bit data programmed by the user will be read out at the same time. The effect of this case in which the bit strings of the password and the group of bit data programmed by the user are arranged in a mixed manner is the same as of the embodiments described earlier in that the bit strings of the password are difficult to identify.

Although the partial memory areas are coupled to the common word line WLx in the foregoing embodiments, the invention is not necessarily limited to this. The invention is equally applicable to cases where the partial memory areas are coupled to a common bit line in place of or in addition to the word line. Additionally, the number of bits that constitute the password is not limited to 64 bits and the bit width of the data input by programming is not limited to 16 bits.

Figure 12:
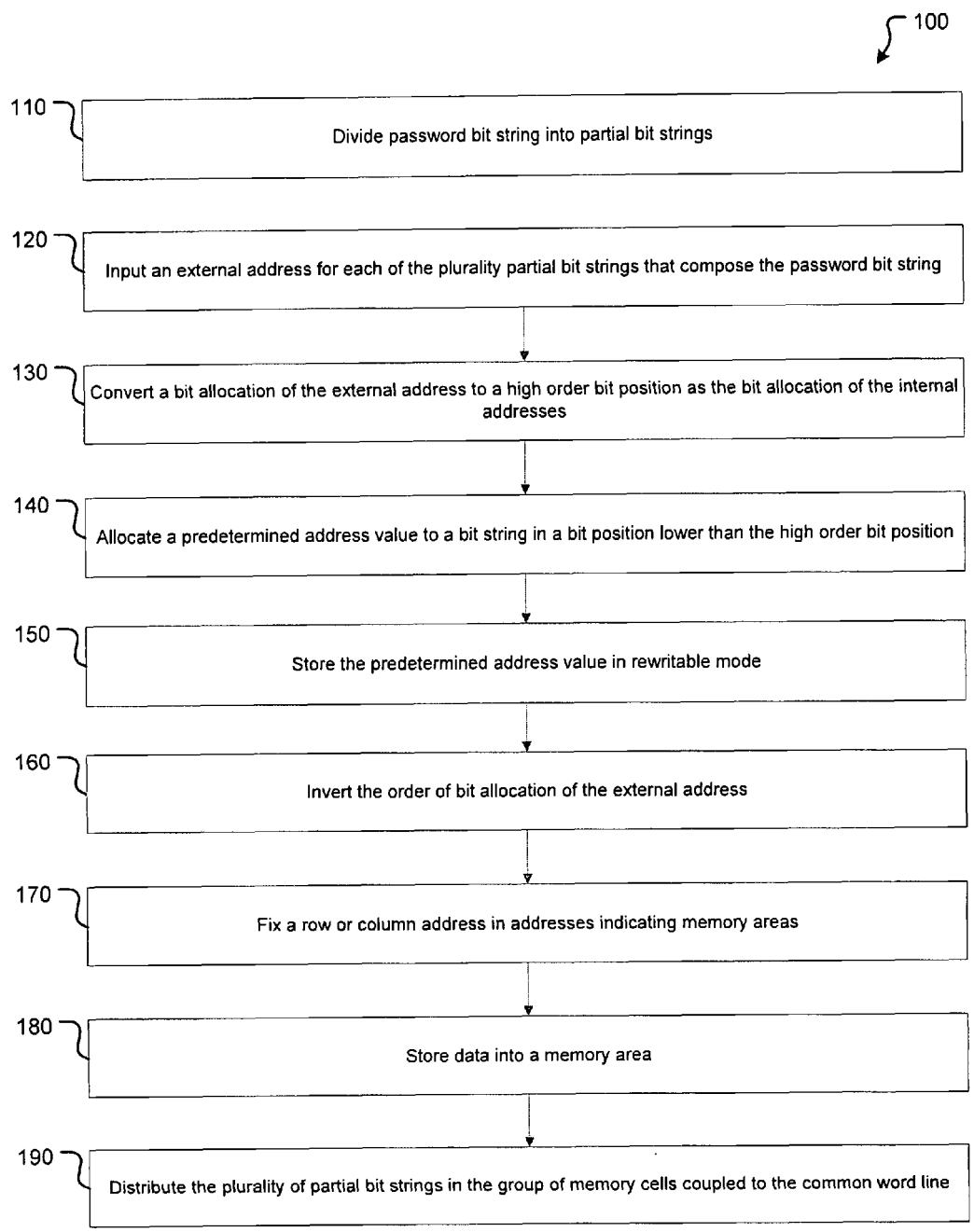
FIG. 12 illustrates a process for storing the password of a memory device in accordance with embodiments of the invention.

FIG. 12 illustrates a process 100 for storing the password of a memory device in accordance with embodiments of the invention. At block 110, a password bit string is divided into a plurality of partial bit strings PW0 to PW3. At block 120 external addresses A0 to A5 for each of the partial bit strings PW0 to PW3 that comprise the entire password bit string is input when the password is written into memory. At block 130, a bit allocation of the external addresses A0 to A5 is converted to high order bit positions as the bit allocation of the internal addresses WA0 to WA5. At block 140 a predetermined address value is allocated to a bit string in a bit position that is lower than the high order bit position of block 130. The predetermined address value is then stored in rewritable mode at block 150. At block 160, the order of bit allocation of the external addresses A0 to A5 is inverted. At block 170, a row or column address in internal addresses WA0 to WA5 indicating memory areas, each of which stores each of the partial bit strings PW0 to PW3 is fixed. Data is stored into a memory area which is undefined as a memory area for the partial bit strings PW0 to PW3 in the memory areas indicated by the fixed addresses at block 180. Then partial bit strings PW0 to PW3 that comprise a bit string of the password in a memory area is discretely distributed in the group of memory cells coupled to the common word line WLx within the auxiliary sector Sx at block 190.

Embodiments generally relate to memory devices. More particularly, embodiments allow for a memory device that has measures protecting the security of the data stored within. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells," each of which traditionally stores one bit of information. However, newer flash memory devices can store more than 1 bit per cell. These newer flash memory devices double the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, the newer flash memory devices have several key advantages, such as being capable of burst-mode access as fast as 80 MHz, page access times as fast as 25 ns, simultaneous read-write operation for combined code and data storage, and low standby power (e.g., 1 µA).

Figure 13:
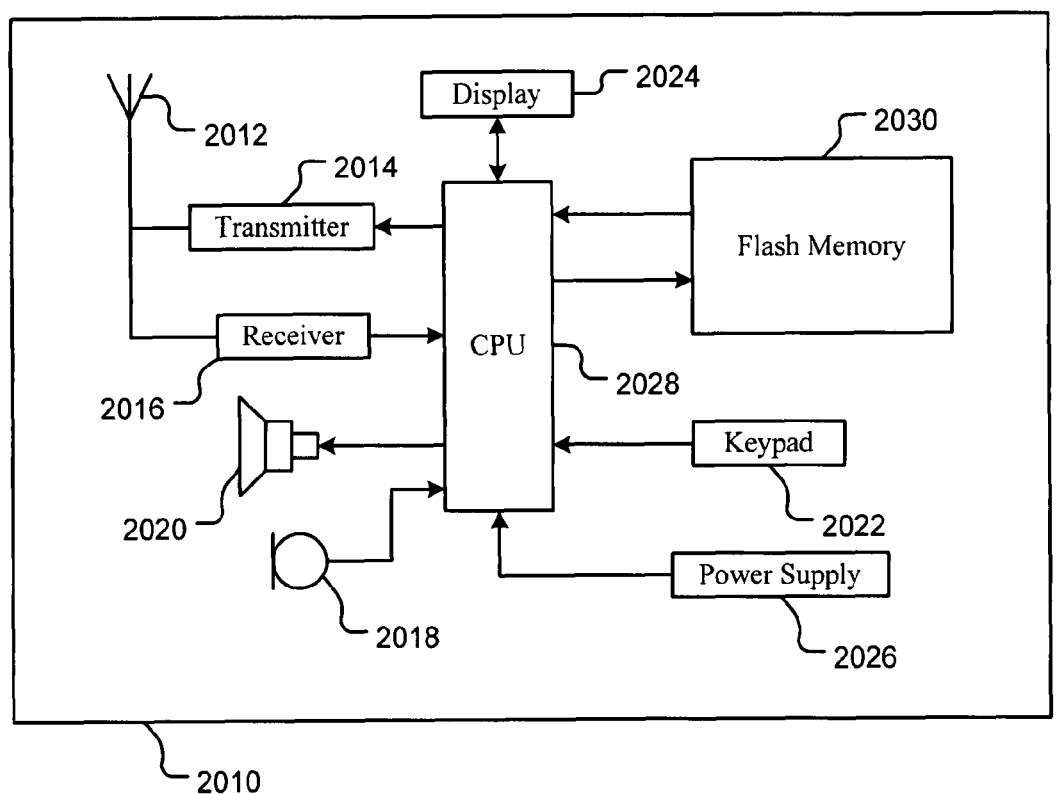
FIG. 13 illustrates a block diagram of an exemplary portable phone, upon which various embodiments of the invention may be implemented.

FIG. 13 shows a block diagram of an exemplary portable telephone 2010 (e.g., cell phone, cellular phone, mobile phone, internet protocol phone, wireless phone, etc.), upon which various embodiments of the invention can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 can include a memory device which makes a determination of whether or not rewriting and/or reading of data is permitted by verification of a password, the memory device comprising a plurality of partial memory areas, each of which stores each of a plurality of partial bit strings that comprise a bit string of the password, and wherein the plurality of partial memory areas are located apart from each other in a memory cell array.

In various embodiments, the flash memory 2030 can be utilized with various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are coupled to the bit lines in a parallel configuration, while in a conventional NAND-type flash memory, the memory cell transistors are coupled to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, an improved flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

It is noted that the components (e.g., 2012, 2014, 2016, 2022, 2028, 2030, etc.) of portable telephone 2010 can be coupled to each other in a wide variety of ways. For example, in an embodiment, the antenna 2012 can be coupled to transmitter 2014 and receiver 2016. Additionally, the transmitter 2014, receiver 2016, speaker 2020, microphone 2018, power supply 2026, keypad 2022, flash memory 2030 and display 2024 can each be coupled to the processor (CPU) 2028. It is pointed out that in various embodiments, the components of portable telephone 2010 can be coupled to each other via, but are not limited to, one or more communication buses, one or more data buses, one or more wireless communication technologies, one or more wired communication technologies, or any combination thereof.

Figure 14:
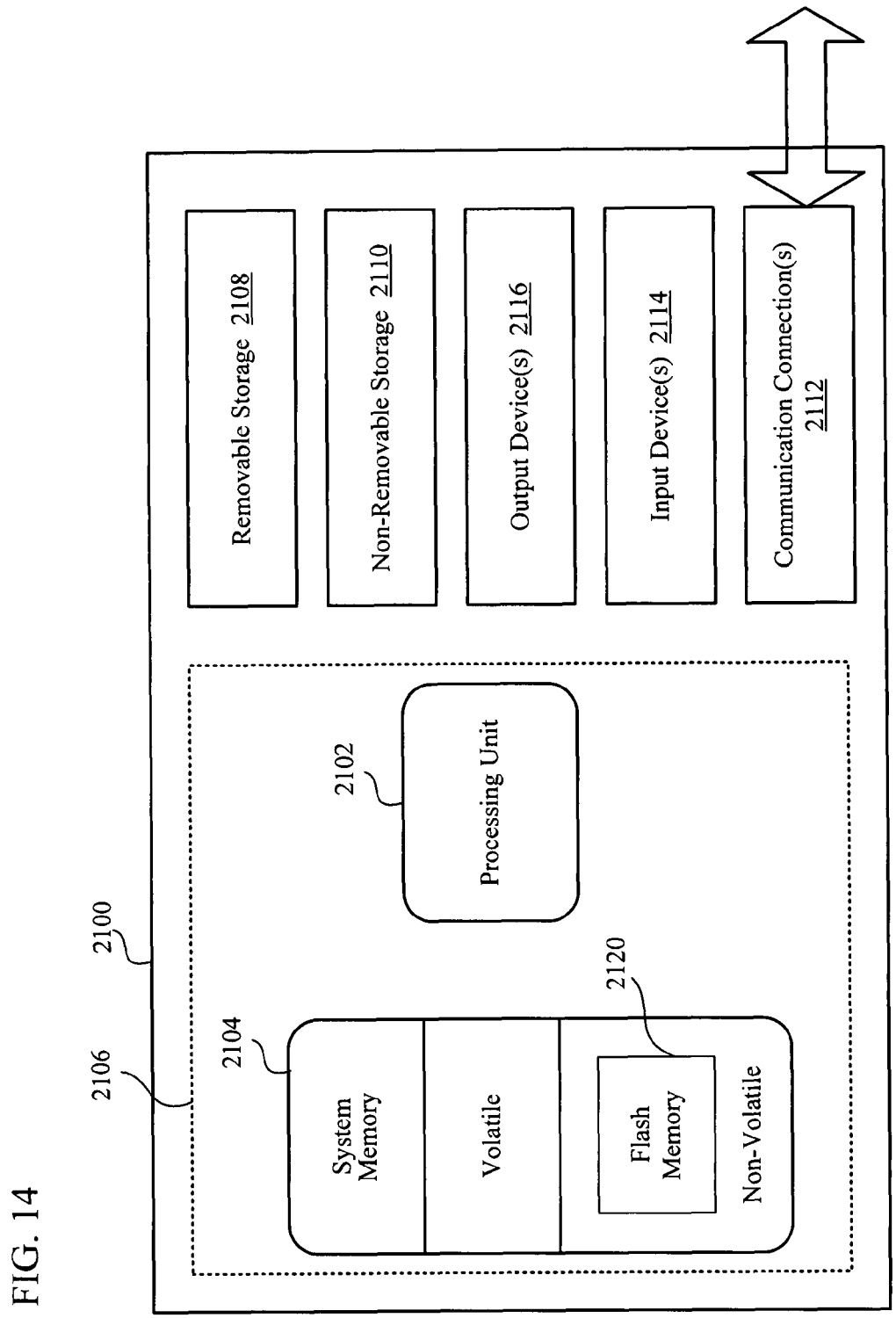
FIG. 14 illustrates a block diagram of an exemplary computing device, upon which various embodiments of the invention may be implemented.

FIG. 14 illustrates a block diagram of an exemplary computing device 2100, upon which various embodiments of the invention can be implemented. Although computing device 2100 is shown and described in FIG. 14 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. In an embodiment, computing device 2100 can include additional components not shown in FIG. 14.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

Computing device 2100 can include at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 14 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could be a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 14 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, Flash memory 2120 can include a memory device which makes a determination of whether or not rewriting and/or reading of data is permitted by verification of a password, the memory device comprising a plurality of partial memory areas, each of which stores each of a plurality of partial bit strings that comprise a bit string of the password, and wherein the plurality of partial memory areas are located apart from each other in a memory cell array.

In various embodiments, the flash memory 2120 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes newer flash memory technology to allow storing of two physically distinct bits on opposite sides of a memory cell.

Device 2100 may also contain communications connection(s) or coupling(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection or coupling, and wireless media such as acoustic, radio frequency (RF), infrared and other wireless media. The term computer readable media as used herein includes both storage media and communication media.

It is noted that the components (e.g., 2102, 2104, 2110, 2120, etc.) of computing device 2100 can be coupled to each other in a wide variety of ways. For example in various embodiments, the components of computing device 2100 can be coupled to each other via, but are not limited to, one or more communication buses, one or more data buses, one or more wireless communication technologies, one or more wired communication technologies, or any combination thereof.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous.

Figure 15:
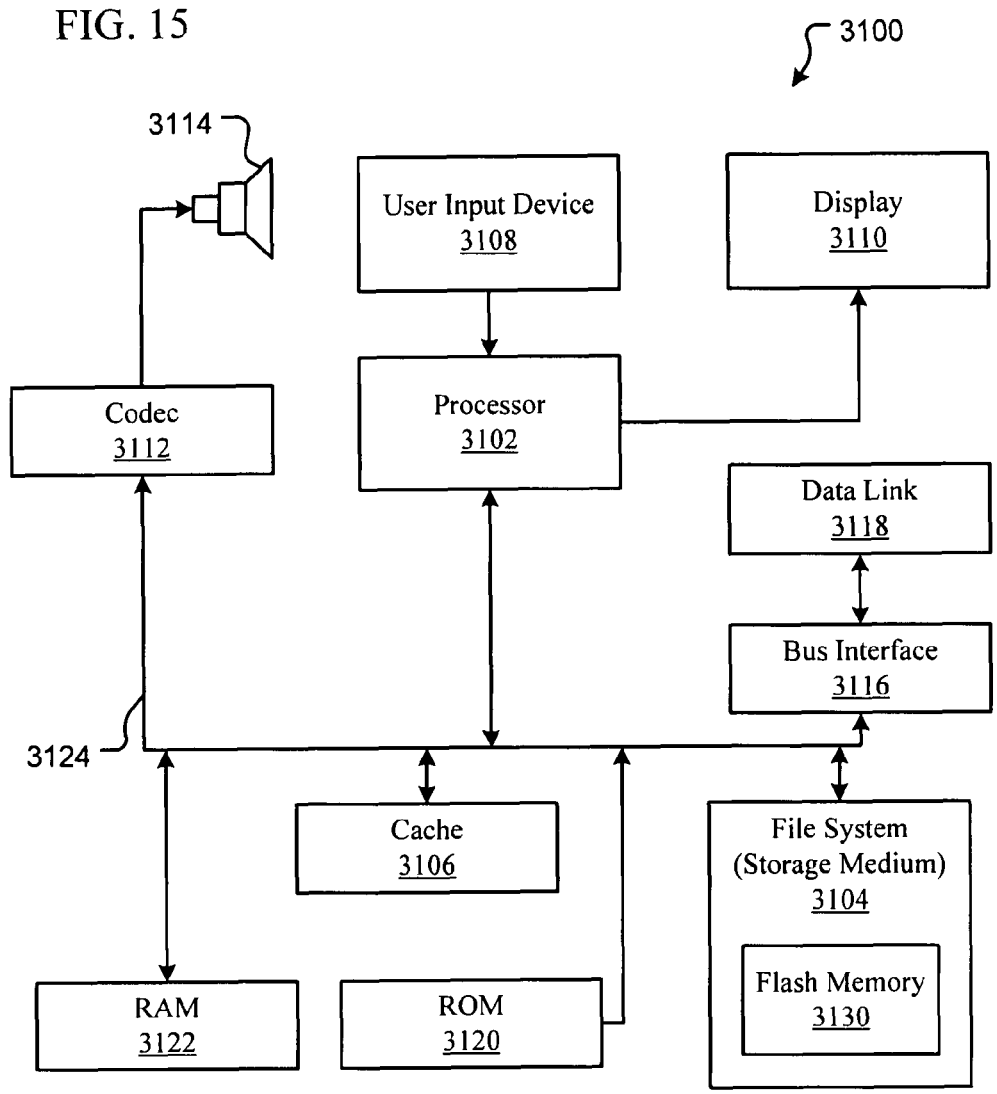
FIG. 15 illustrates an exemplary portable multimedia device, or media player, in accordance with various embodiments of the invention.

FIG. 15 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, Flash memory 3130 can include a memory device which makes a determination of whether or not rewriting and/or reading of data is permitted by verification of a password, the memory device comprising a plurality of partial memory areas, each of which stores each of a plurality of partial bit strings that comprise a bit string of the password, and wherein the plurality of partial memory areas are located apart from each other in a memory cell array. In various embodiments, the flash memory 3130 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that couple to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

It is noted that the components (e.g., 3102, 3104, 3120, 3130, etc.) of media player 3100 can be coupled to each other in a wide variety of ways. For example, in an embodiment, the codec 3122, RAM 3122, ROM 3120, cache 3106, processor 3102, storage medium 3104, and bus interface 3116 can be coupled to data bus 3124. Furthermore, the data link 3118 can be coupled to the bus interface 3116. The user input device 3108 and the display 3110 can be coupled to the processor 3102 while the speaker 3114 can be coupled to the codec 3112. It is pointed out that in various embodiments, the components of media player 3100 can be coupled to each other via, but are not limited to, one or more communication buses, one or more data buses, one or more wireless communication technologies, one or more wired communication technologies, or any combination thereof.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. A memory device which makes a determination of whether or not rewriting and/or reading of data is permitted by verification of a password, the memory device comprising:
   a plurality of partial memory areas, each of which stores a plurality of partial bit strings that comprise a bit string of the password, wherein the plurality of partial memory areas is located apart from each other in a memory cell array wherein the partial bit strings are compared to a purported password that is received.

2. The memory device according to claim 1, wherein the plurality of partial memory areas share one of a word line and a bit line.

3. The memory device according to claim 2, wherein, in the memory areas which share the word line or the bit line, a memory area undefined as the partial memory area is used as a data area.

4. The memory device according to claim 3, wherein a dummy data is written into the data area.

5. The memory device according to claim 1, comprising a first address converter circuit wherein, when the plurality of partial bit strings each receive an input of an external address in writing of the password, the first address converter circuit converts a bit allocation of the external address to output an internal address that indicates the partial memory area.

6. The memory device according to claim 5, wherein the first address converter circuit converts a bit allocation of the internal address to a higher-order bit position than the bit allocation of the external address.

7. The memory device according to claim 6, further comprising:
   a second address converter circuit that allocates a predetermined address value to a bit string which is in a lower-bit position than the internal address output from the first address converter circuit; and
   an information storage section, into which the predetermined address value is written.

8. The memory device according to claim 5, wherein the first address converter circuit converts the bit allocation of the internal address to a different order from the bit allocation of the external address.

9. A password storing method of a memory device which makes a determination of whether or not rewriting and/or reading of data is permitted by verification of a password, the method comprising:
   storing a plurality of partial bit strings that comprise a bit string of the password to be located apart from each other wherein the partial bit strings are compared to a purported password that is received.

10. The password storing method according to claim 9, wherein said storing said plurality of partial bit strings that comprise a bit string of the password to be located apart from each other further comprises:
    fixing a row address or a column address in addresses indicating memory areas, which store the partial bit strings.

11. The password storing method according to claim 10, further comprising:
    storing data into a memory area, which is undefined as a memory area for the partial bit strings in memory areas indicated by the fixed addresses.

12. The password storing method according to claim 9, further comprising: inputting an external address for the partial bit strings when writing the password; and
    converting a bit allocation of the external address to an internal address indicating a memory area in which the partial bit string is stored.

13. The password storing method according to claim 12, wherein said converting of said bit allocations of the external addresses to internal addresses indicating a memory area in which the partial bit strings are stored includes converting bit allocations of the external addresses to a high-order bit position.

14. The password storing method according to claim 13, further comprising:
    allocating a predetermined address value to a bit string in a bit position lower than the high-order bit position.

15. The password storing method according to claim 14, wherein said allocating of said predetermined address value includes storing the predetermined address value in rewritable manner.

16. The password storing method according to claim 12, wherein the converting of said bit allocation of the external address to an internal address indicating a memory area in which the partial bit string is stored includes changing the order of the bit allocation of the external address.

17. A system, comprising:
    a processor; a cache;
    a user input component; and
    a flash memory, including a memory device which makes a determination of whether or not rewriting and/or reading of data is permitted by verification of a password, the memory device comprising:
    a plurality of partial memory areas each of which stores a plurality of partial bit strings that comprise a bit string of the password wherein the partial bit strings are compared to a purported password that is received, and wherein the plurality of partial memory areas are located apart from each other in a memory cell array.

18. The system as recited in claim 17 wherein the system is a portable media player.

19. The system as recited in claim 17 wherein the system is a cellular telephone.

20. The system as recited in claim 17 wherein the system is a computing device.

* * * * *